United States Patent
Lu et al.

(10) Patent No.: US 9,841,737 B2
(45) Date of Patent: Dec. 12, 2017

(54) AUTOMATIC TEST SYSTEM AND METHOD

(71) Applicant: CHROMA ATE INC., Taoyuan (TW)

(72) Inventors: Chih-Cherng Lu, Taoyuan (TW); Chia-Ching Ting, Taoyuan (TW); Chuan-Tse Lin, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 136 days.

(21) Appl. No.: 14/961,535

(22) Filed: Dec. 7, 2015

(65) Prior Publication Data

US 2016/0291080 A1     Oct. 6, 2016

(30) Foreign Application Priority Data

Apr. 1, 2015    (TW) .............................. 104110743 A

(51) Int. Cl.
| | |
|---|---|
| *G05B 11/01* | (2006.01) |
| *G01R 31/28* | (2006.01) |
| *G01R 31/36* | (2006.01) |
| *G01R 35/00* | (2006.01) |
| *G01R 31/319* | (2006.01) |

(52) U.S. Cl.
CPC .......... *G05B 11/01* (2013.01); *G01R 31/2834* (2013.01); *G01R 31/3641* (2013.01); *G01R 35/00* (2013.01); *G01R 31/3191* (2013.01); *G01R 35/005* (2013.01)

(58) Field of Classification Search
CPC .... G01R 31/00; G01R 31/28; G01R 31/2832; G01R 31/2834; G01R 31/318307; G01R 31/3191; G01R 31/31924; G01R 31/3658; G01R 35/00; G01R 35/005; G01R 31/36; G01R 31/3627; G01R 31/3641; G07D 2205/0012; G08B 29/20; G05B 11/00; G05B 11/01

USPC ........ 324/500, 511, 537, 750.01, 750.02, 74, 324/76.11, 130, 600, 601, 425, 426, 430, 324/432, 433; 702/85

See application file for complete search history.

(56) References Cited

U.S. PATENT DOCUMENTS

| | | | | |
|---|---|---|---|---|
| 5,716,243 | A * | 2/1998 | Kourimsky | ............. B60R 16/04 439/761 |
| 6,586,940 | B2 * | 7/2003 | Asakura | ............. G01R 31/3679 324/426 |
| 7,567,085 | B2 * | 7/2009 | Kim | ................... G01R 31/3679 324/426 |
| 9,187,004 | B1 * | 11/2015 | Davis | ................... B60L 11/1822 |
| 2008/0174268 | A1 * | 7/2008 | Koo | ....................... A47L 9/2805 320/109 |

(Continued)

*Primary Examiner* — Hoai-An D Nguyen
(74) *Attorney, Agent, or Firm* — Maschoff Brennan

(57) ABSTRACT

An automatic test system and method are provided. The automatic test system includes at least one formation apparatus and a test fixture. The formation apparatus receives a first control command from a network and executes a test procedure according to the first control command. The test procedure includes a charging mode and a discharging mode. The test fixture is selectively coupled to the formation apparatus. During the test procedure, when the test fixture is coupled to the formation apparatus, the test fixture generates a first measurement result. The test fixture transmits the first measurement result to the formation apparatus via a wireless communication interface of the test fixture.

11 Claims, 4 Drawing Sheets

(56) References Cited

U.S. PATENT DOCUMENTS

2015/0367513 A1* 12/2015 Gettings ............... G06Q 10/06
700/248

* cited by examiner

AUTOMATIC TEST SYSTEM AND METHOD

CROSS-REFERENCE TO RELATED APPLICATIONS

This non-provisional application claims priority under 35 U.S.C. §119(a) on Patent Application No(s). 104110743 filed in Taiwan, R.O.C. on 2015 Apr. 1, the entire contents of which are hereby incorporated by reference.

TECHNICAL FIELD

The disclosure relates to an automatic test system and method, more particularly to a system and method of automatically testing battery formation apparatuses.

BACKGROUND

The activation of a battery is indispensable during the manufacturing of the battery. Activating batteries requires a formation apparatus to charge and discharge the batteries by accurate voltage and current control. Therefore, such a formation apparatus sometimes needs to be calibrated and verified to maintain its accuracy of voltage and current control, thereby maintaining the manufacturing of high quality batteries.

However, in practice, the battery production flow is becoming more complicated, the production capacity is getting higher, and production lines have been automated more and more. Under such a scenario, conventional test methods have become inadequate for the needs. Therefore, there is a need to develop an automatic test apparatus and method capable of systematically enhancing the test efficiency of the formation apparatus.

SUMMARY

According to one or more embodiments, the disclosure provides an automatic test system. In one embodiment, the automatic test system includes at least one battery formation apparatus and a test fixture. The battery formation apparatus receives a first control command from a network and performs a test procedure according to the first control command. The test procedure includes a charging mode and a discharging mode. The test fixture includes a wireless transmission interface and is selectively coupled to the at least one battery formation apparatus. The test fixture, in response to the test procedure, generates a first measurement result and sends the first measurement result to the at least one battery formation apparatus via the wireless transmission interface when coupled to the at least one battery formation apparatus.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
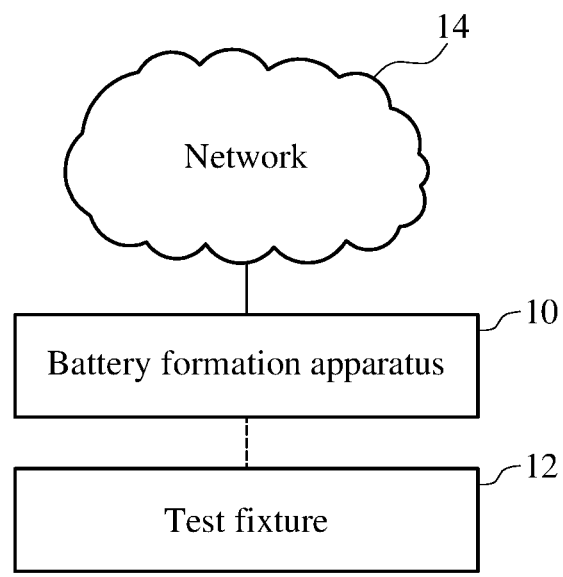
FIG. 1 is a functional block diagram of an automatic test system according to an embodiment of the disclosure.

Please refer to FIG. 1, which is a functional block diagram of an automatic test system according to an embodiment of the disclosure. The automatic test system includes at least one battery formation apparatus 10 and a test fixture 12. The battery formation apparatus 10 receives a control command (referred to as first control command) from a network 14 and performs a test procedure according to the received control command. The test procedure includes a charging mode and a discharging mode. The test fixture 12 is selectively coupled to the battery formation apparatus 10.

When the test fixture 12 is coupled to the battery formation apparatus 10 in response to the test procedure, the test fixture 12 generates a first measurement result and sends the first measurement result to the battery formation apparatus 10 through a wireless transmission interface of the test fixture 12.

In an embodiment, the automatic test system includes a plurality of battery formation apparatuses 10. The automatic test system can select one of the battery formation apparatus 10 according to the first control command for checking.

In practice, the network 14 is, for example but not limited to, a local area network (LAN), a wide area network, or a mobile network. The wireless transmission interface is carried out by, for example but not limited to, a wireless LAN, bluetooth, or IEEE 802.15.4 (ZigBee) technology.

Figure 2:
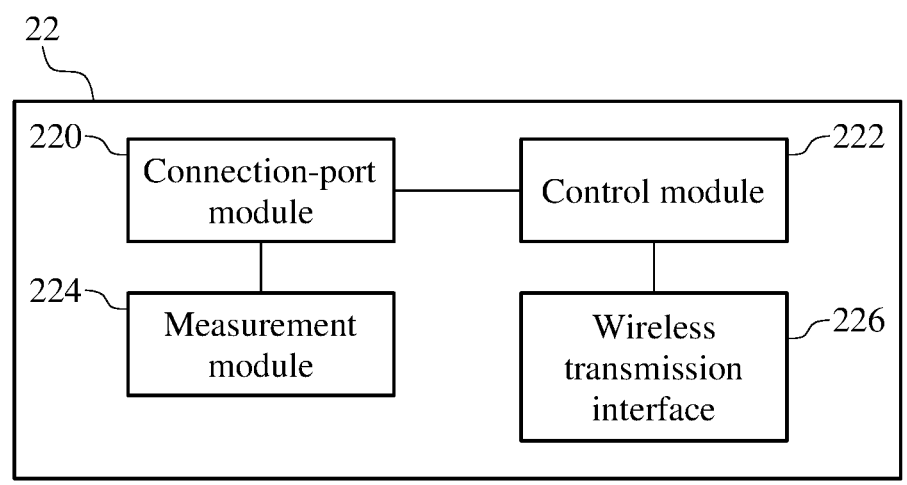
FIG. 2 is a functional block diagram of the test fixture according to an embodiment of the disclosure.

Please refer to FIG. 2, which is a functional block diagram of the test fixture according to an embodiment of the disclosure. The test fixture 22 includes a connection-port module 220, a control module 222, a measurement module 224, and a wireless transmission interface 226. When the test fixture 22 is coupled to the battery formation apparatus 10, the test fixture 22 simulates virtual batteries where the connection-port module 220 provides the connection ports of the electrodes of the virtual batteries. When the test fixture 22 is electrically connected to the battery formation apparatus 10, the simulation of charging or discharging real batteries by the battery formation apparatus can be carried out.

The control module 222 is coupled to the connection-port module 220 and exchanges test instructions with the battery formation apparatus 10 through the wireless transmission interface 226. According to the test instruction or data, the test fixture 22 and the battery formation apparatus can perform battery charging (i.e. the charging mode) or battery discharging (i.e. the discharging mode) through the electrical connection of the connection-port module 220.

The measurement module 224 is coupled to the connection-port module 220 and measures the connection-port module 220 under the charging mode and the discharging mode to produce a first measurement result. Also, the measurement module 224 sends the first measurement result to the battery formation apparatus 10 through a wireless transmission module. The measurement module 224 is, for example but not limited to, a digital multimeter.

In details, when the test fixture 22 and the battery formation apparatus 10 send test instructions to each other in order to perform the charging mode, the control module 222 sends test instructions to command the battery formation apparatus 10 to supply charging power and turns the virtual batteries into a load mode, so as to charge the test fixture 22. When the test fixture 22 and the battery formation apparatus 10 operate under the discharging mode by sending test instructions to each other, the control module 222 sets the virtual batteries to be at a power supply mode where the virtual batteries have stored electricity, to discharge the test fixture 22. The measurement module 224 measures voltages and currents on the connection-port module 220 under the charging mode and the discharging mode to generate a first measurement result. In general, the battery formation apparatus 10 includes multiple channels and relative electrodes so that can simultaneously charging or discharging multiple batteries. In an embodiment, the connection-port module 220 includes multiple sets of electrodes for simulating multiple batteries, channels and their electrodes in response to the exchanging of test instructions, so as to charge, discharge and measure multiple virtual batteries under the test procedure.

Furthermore, the test procedure in an embodiment includes calibrating and verifying the battery charge and discharge apparatus 10. During the calibration of the battery charge and discharge apparatus 10, the battery charge and discharge apparatus 10 considers the first measurement result as standard values, converts them into calibration values, and records the calibration values in the battery charge and discharge apparatus 10. In an embodiment, the first measurement result indicates multiple voltage values or current values, and the calibration values are generated by averaging these voltage or current values or by converting these voltage or current values into a charging-discharging characteristic curve. Accordingly, the battery charge and discharge apparatus 10 can accurately charge and discharge batteries according to the new calibration values during the manufacturing of batteries.

On the other hand, during the verification of the battery formation apparatus 10, the battery formation apparatus 10 not only receives the first measurement result but also automatically measures the voltage and current values of the virtual batteries under the charging mode and the discharging mode to generate a second measurement result. Therefore, the battery formation apparatus 10 can set the first measurement result as a standard and compare the first measurement result with the second measurement result to generate a test result that recites the relationship of measure values and standard values and indicates the equipment's statuses. For instant, the test result includes voltage or current difference values between the first measurement result and the second measurement result. When the difference value is less than a preset threshold, it indicates that the battery formation apparatus 10 matches a standard accuracy. In contrast, when the difference value is larger than or equal to the preset threshold, it indicates that the battery formation apparatus 10 does not match the standard accuracy and needs to enhance its accuracy level by calibration.

Figure 3:
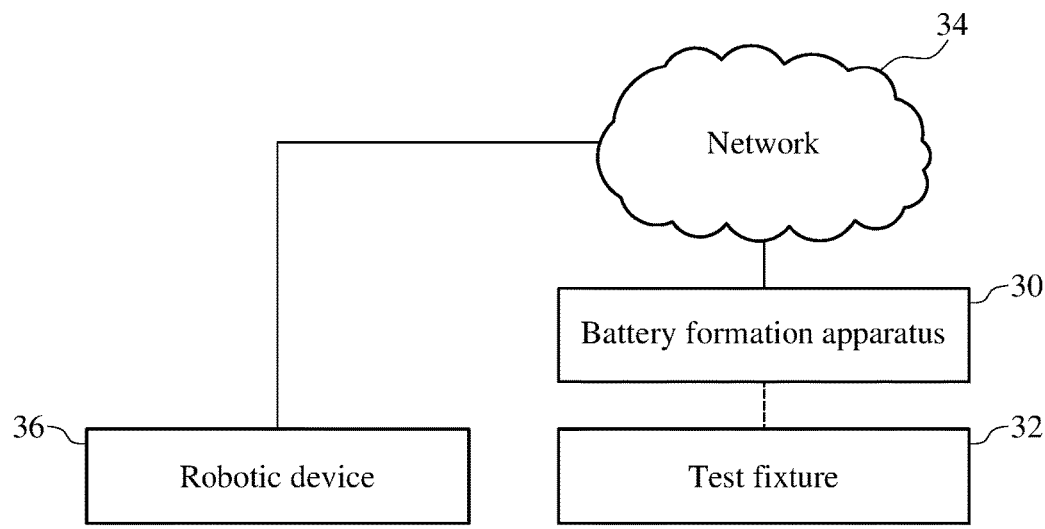
FIG. 3 is a functional block diagram of an automatic test system according to another embodiment of the disclosure.

Please refer to FIG. 3, which is a functional block diagram of an automatic test system according to another embodiment of the disclosure. The automatic test system includes at least one battery formation apparatus 30, a test fixture 32, and a robotic device 36, e.g. a robotic arm. The battery formation apparatus 30 receives a first control command from a network 34 and, according to the first control command, performs a test procedure. The robotic device 36 receives a second control command from the network 34 and according to the second control command, moves the test fixture 32 so that the test fixture 32 is coupled to the battery formation apparatus 30.

When the test fixture 32 is coupled to the battery formation apparatus 30 in response to the test procedure, the test fixture 32 generates a first measurement result and sends the first measurement result to the battery formation apparatus 30 through a wireless transmission interface of the test fixture 32.

In an embodiment, the automatic test system includes a plurality of battery formation apparatuses 30. One of the battery formation apparatuses 30 is selected for a current test task according to the first control command, and the robotic device 36 moves the test fixture 32 according to the second control command. Then, the test fixture 32 is coupled to the selected battery formation apparatus 30. In an example, the computer-integrated manufacture (CIM) equipment linking to the network 34 is employed to generate a control command (i.e. the first control command) by an appointment scheduling to enable the foregoing test procedure and also generate another control command (i.e. the second control command) by the appointment scheduling to control the robotic device 36.

In an embodiment, the foregoing first measurement result, the second measurement result, and the test result can further be sent to the computer-integrated manufacture equipment through the network so that the computer-integrated manufacture equipment can establish a database for storing these results and further integrate and analyze them to establish references for the manufacturing of battery and the maintenance of equipment.

In an embodiment, the above appointment scheduling is a preset regular scheduling or is defined according to the analysis of measure results and test results to decide a schedule of the test procedure. In the disclosure, the above appointment scheduling can be designed according to actual application requirements.

Figure 4:
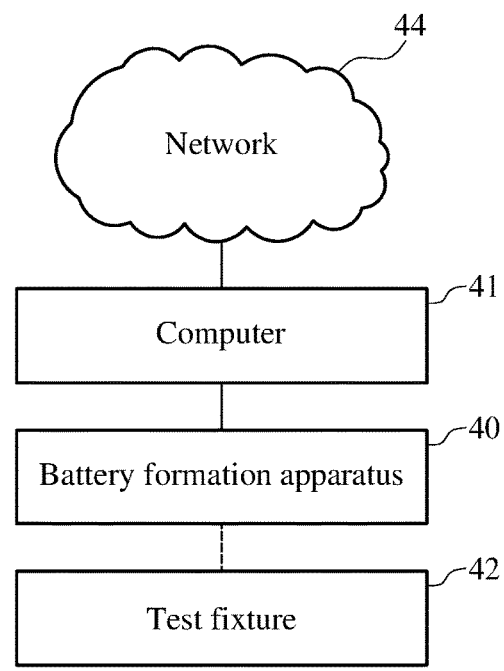
FIG. 4 is a functional block diagram of an automatic test system according to another embodiment of the disclosure.

Please refer to FIG. 4, which is a functional block diagram of an automatic test system according to another embodiment of the disclosure. The automatic test system includes at least one computer 41 and a test fixture 42. The computer 41 controls a battery formation apparatus 40. Specifically, the computer 41 receives a control command (hereinafter referred to as first control command) from a network 44 and controls the battery formation apparatus 40 to perform a test procedure according to the first control command. The test procedure includes a charging mode and a discharging mode. The test fixture 42 is selectively coupled to the battery formation apparatus 40. When the test fixture 42 is coupled to the battery formation apparatus 40 in response to the test procedure, the test fixture 42 generates a first measurement result and sends the first measurement result to the computer 41 through a wireless transmission interface of the test fixture 42.

In an embodiment, the test fixture 42 includes a connection-port module, a control module, and a measurement module. The control module exchanges test instructions with the computer 41 through the wireless transmission interface, so as to perform the charging mode and the discharging mode through the electrical connections of the connection-port module. The details of the charging and discharging modes and the details of measurement can be referred to the aforementioned relative embodiments and will not be repeated hereinafter.

Moreover, the above test procedure includes the calibration and verification of the battery formation apparatus 40. When the battery formation apparatus 40 is being calibrated, the computer 41 sets the first measurement result as a standard to generate test values and writes the test values into the battery formation apparatus 40. When the battery formation apparatus 40 is being verified, the computer 41 receives the first measurement result and controls the battery formation apparatus 40 to measure voltage values and current values under the charging mode and the discharging mode to generate a second measurement result. Therefore, the computer 41 sets the first measurement result as the standard and compares the first measurement result with the second measurement result to generate a test result that indicates the relationship of measurement values and standard values for estimating the statuses of the battery formation apparatus 40.

Figure 5:
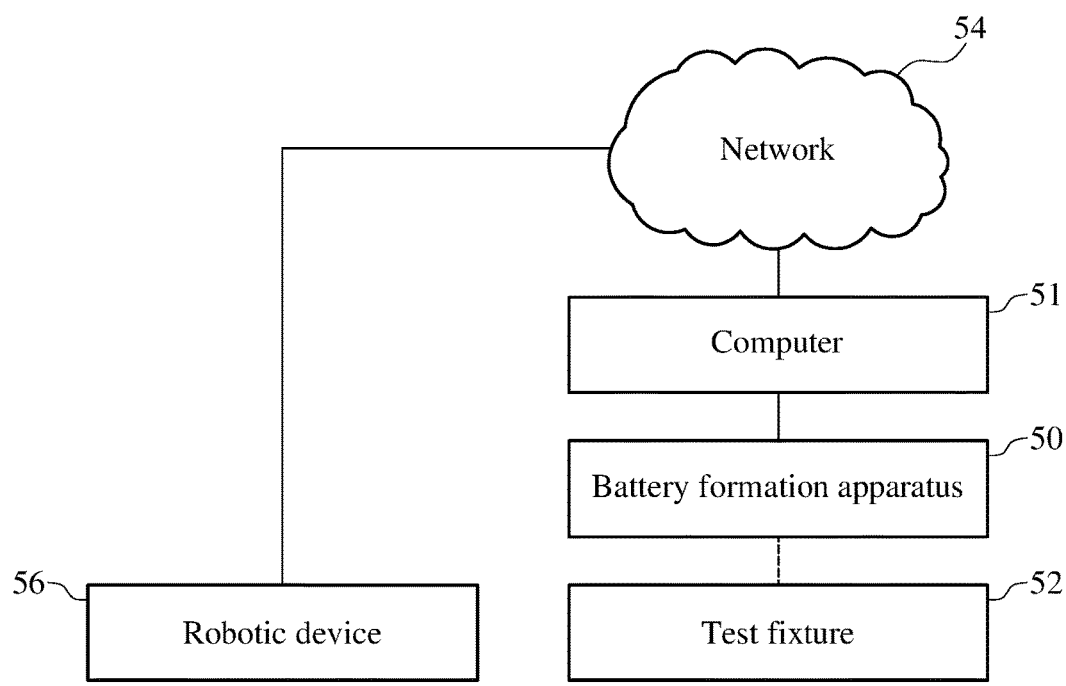
FIG. 5 is a functional block diagram of an automatic test system according to another embodiment of the disclosure.

Please refer to FIG. 5, which is a functional block diagram of an automatic test system according to another embodiment of the disclosure. The automatic test system includes at least one computer 51, a test fixture 52, and a robotic device 56. The computer 51 receives a first control command from a network 54 and performs a test procedure according to the first control command. The robotic device 56 receives a second control command from the network 54 and moves the test fixture 52 according to the second control command so that the test fixture 52 is coupled to the battery formation apparatus 50. When the test fixture 52 is coupled to the battery formation apparatus 50 in the test procedure, the test fixture 52 generates a first measurement result and sends it to the computer 51 through a wireless transmission interface of the test fixture 52.

In an embodiment, the automatic test system further includes a plurality of battery formation apparatuses, and one of the battery formation apparatuses is selected for the test task according to the first control command. Also, according to the second control command, the robotic device 56 moves the test fixture 52 so that the test fixture 52 is coupled to the selected battery formation apparatus.

Figure 6:
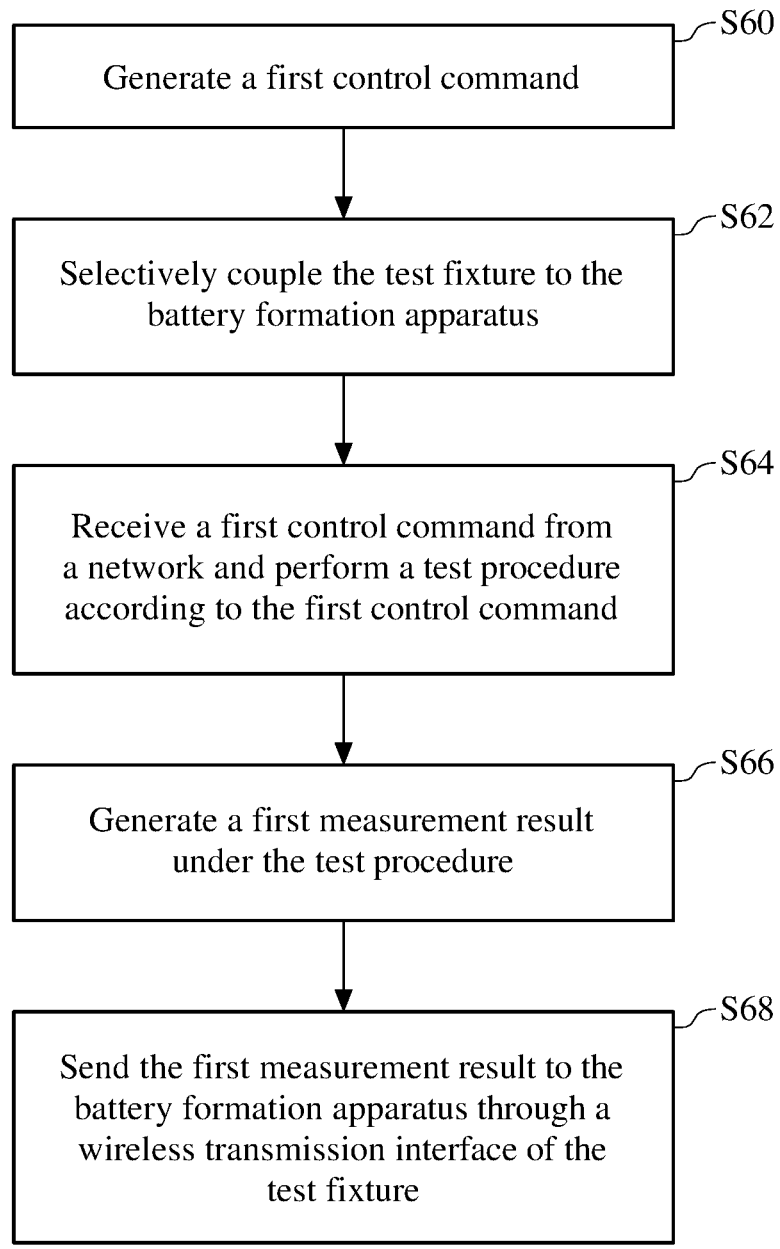
FIG. 6 is a flow chart of an automatic test method according to another embodiment of the disclosure.

Please refer to FIG. 6, which is a flow chart of an automatic test method according to another embodiment of the disclosure. The automatic test method is applied to an automatic test system which includes at least one battery formation apparatus and a test fixture. First, generate a first control command to enable a test procedure (S60). Then, selectively couple the test fixture to the battery formation apparatus (S62). Next, receive a first control command from a network and perform the test procedure according to the first control command by the battery formation apparatus (S64). The test procedure includes a charging mode and a discharging mode. Also, generate a first measurement result under the test procedure by test fixture (S66). Then, send the first measurement result to the battery formation apparatus through a wireless transmission interface of the test fixture under the test fixture (S68).

In another embodiment of the automatic test method, the test fixture includes a connection-port module, a control module, and a measurement module, and the automatic test method further includes the following steps. Under the charging mode, the control module uses test instructions to command the battery formation apparatus to supply power. Also, the control module turns virtual batteries simulated by the test fixture into a load mode so that the battery formation apparatus and the test fixture operate under the charging mode. Under the discharging mode, the control module turns the virtual batteries into a power supply mode where the virtual batteries are set to have electricity, and controls the battery formation apparatus and the test fixture to operate under the discharging mode. The measurement module measures voltage values and current values on the connection-port module under the charging mode and the discharging mode to generate a first measurement result.

In another embodiment, the automatic test method further includes the calibration and verification of the battery formation apparatus. During the calibration of the battery formation apparatus (i.e. the calibration procedure), the automatic test method further includes writing the received first measurement result into the battery formation apparatus. During the verification of the battery formation apparatus (i.e. the verification procedure), the automatic test method further includes the following steps. First, the battery formation apparatus automatically measures voltage values and current values on the connection-port module under the charging mode and the discharging mode to generate a second measurement result. Then, the battery formation apparatus compares the first measurement result with the second measurement result to generate a verification result. In practice, the battery formation apparatus sends the first measurement result, the second measurement result, and the verification result to a computer-integrated manufacture equipment through a network so that the computer-integrated manufacture equipment can integrate and analyze the first measurement result, the second measurement result, and the verification result.

In another embodiment of the automatic test method, the automatic test system further includes a robotic device, and the step of coupling the test fixture to the battery formation apparatus further includes that the robotic device receives a second control command from the network and moves the test fixture according to the second control command so that the test fixture and the battery formation apparatus are coupled. When the automatic test system includes a plurality of battery formation apparatuses, an appointment scheduling is performed to select which battery formation apparatus the test procedure is performed to, and define the timing, so as to generate a corresponding first control command and second control command.

In another embodiment, before the verification procedure is performed, the automatic test method further includes the following steps. First, the battery formation apparatus receives a power-off command. After responding the success of power-off, the battery formation apparatus receives a cooling command. After responding the success of cooling, the battery formation apparatus controls the robotic device to move the test fixture so that the test fixture and the battery formation apparatus are coupled. Then, after the verification procedure is finished, the automatic test method further includes the following steps. First, control the robotic device to move the test fixture so that the test fixture is separated from the battery formation apparatus. Next, the battery formation apparatus receives a warming-up command. After responding the success of warming-up, the battery formation apparatus receives a power restoration command. After the battery formation apparatus responds the success of power restoration, the restoration procedure is finished. In practice, the computer-integrated manufacture equipment provides the above commands through the network.

In another embodiment, during the verification procedure, the automatic test method further includes the following steps. First, the test fixture checks whether an auxiliary power source operates normally, to ensure that the power supplied to the test fixture is normal during the verification procedure. Then, the test fixture sets voltage and current parameters and controls the conductive statuses of connection ports. After entering into the charging or discharging mode, the measurement module is waiting or on standby until the measurement environment is stable, and then measures voltage and current values.

What is claimed is:

1. An automatic test system, comprising:
at least one battery charge and discharge apparatus, for receiving a first control command from a network and starting a test procedure according to the first control command; and
a test fixture comprising a wireless transmission interface and selectively coupled to the at least one battery charge and discharge apparatus, for providing a virtual battery and charging and discharging the virtual battery for measuring electric properties of the virtual battery to generate a first measurement result and send the first measurement result to the at least one battery charge and discharge apparatus via the wireless transmission interface when being coupled to the battery charge and discharge apparatus in the test procedure,
wherein the battery charge and discharge apparatus charges and discharges the virtual battery for measuring electric properties of the virtual battery to generate a second measurement result and compares the first measurement result with the second measurement result to obtain difference values between the first measurement result and the second measurement result.

2. The automatic test system according to claim 1, further comprising:
a robotic device, for receiving a second control command from the network and moving the test fixture according to the second control command, so as to couple the test fixture to the at least one battery charge and discharge apparatus.

3. The automatic test system according to claim 1, wherein the test fixture comprises:
a connection-port module, comprising electrodes for forming the virtual battery electrically connected to the at least one battery charge and discharge apparatus when the test fixture is coupled to the at least one battery charge and discharge apparatus in the test procedure;
a control module coupled to the connection-port module, for charging and discharging the virtual battery; and
a measurement module coupled to the connection-port module, for measuring the one or more electric properties of the virtual battery to generate the first measurement result and sending the first measurement result to the at least one battery charge and discharge apparatus through the wireless transmission interface.

4. The automatic test system according to claim 1, wherein the at least one battery charge and discharge apparatus, after receiving the first measurement result, calibrates charging and discharging settings of the battery charge and discharge apparatus in relation to the first measurement result in the test procedure based on the first measurement result.

5. An automatic test system for at least one battery charge and discharge apparatus, comprising:
at least one computer, for receiving a first control command from a network and controlling the at least one battery charge and discharge apparatus to start a test procedure according to the first control command; and
a test fixture comprising a wireless transmission interface and selectively coupled to the at least one battery charge and discharge apparatus, for providing virtual battery and charging and discharging the virtual battery for measuring one or more electric properties of the virtual battery to generate a first measurement result and send the first measurement result to the at least one computer through the wireless transmission interface when coupled to the battery charge and discharge apparatus in the test procedure,
wherein the battery charge and discharge apparatus coupled to the test fixture in the test procedure charges and discharges the virtual battery for measuring one or more electric properties of the virtual battery to generate a second measurement result, and compares the first measurement result with the second measurement result to obtain difference values between the first measurement result and the second measurement result.

6. The automatic test system according to claim 5, wherein the at least one computer calibrates charging and discharging settings of the battery charge and discharge apparatus in relation to the first measurement result based on the first measurement result after receiving the first measurement result.

7. The automatic test system according to claim 5, further comprising:
a robotic device, for receiving a second control command from the network and moving the test fixture according to the second control command, so as to couple the test fixture to the at least one battery charge and discharge apparatus.

8. The automatic test system according to claim 5, wherein the test fixture comprises:
a connection-port module, comprising electrodes for forming the virtual battery electrically connected to the at least one battery charge and discharge apparatus when the test fixture is coupled to the at least one battery charge and discharge apparatus in the test procedure;
a control module coupled to the connection-port module, for charging and discharging the virtual battery through the connection-port module; and
a measurement module, coupled to the connection-port module, for measuring the one or more electric properties of the virtual battery to generate the first measurement result and sending the first measurement result to the at least one battery charge and discharge apparatus through the wireless transmission interface.

9. An automatic test method applied to an automatic test system that comprises at least one battery charge and discharge apparatus and a test fixture, and comprising steps of:
generating a first control command;
selectively coupling the test fixture to the at least one battery charge and discharge apparatus;
by the at least one battery charge and discharge apparatus, receiving the first control command from a network and according to the first control command, starting a test procedure, in which the battery charge and discharge apparatus coupled to the test fixture charges and discharges a virtual battery for measuring one or more electric properties of the virtual battery to generate a second measurement result, and compares a first measurement result with the second measurement result to obtain difference values between the first measurement result and the second measurement result; and
by the test fixture, providing the virtual battery, and charging and discharging the virtual battery for measuring one or more electric properties of the virtual battery to generate the first measurement result and send the first measurement result to the battery charge and discharge apparatus when the test fixture is coupled to the battery charge and discharge apparatus in the test procedure.

10. The automatic test method according to claim 9, wherein the automatic test system further comprises a robotic device, and the step of selectively coupling the test fixture to the at least one battery charge and discharge apparatus comprises:

receiving a second control command from the network and moving the test fixture according to the second control command by the robotic device, so as to couple the test fixture to the at least one battery charge and discharge apparatus.

11. The automatic test method according to claim 9, further comprising:

calibrating charging and discharging settings of the at least one battery charge and discharge apparatus in relation to the first measurement result based on the first measurement result by the at least one battery charge and discharge apparatus after the at least one battery charge and discharge apparatus receives the first measurement result.

\* \* \* \* \*